United States Patent
Yamamura

(10) Patent No.: US 12,185,600 B2
(45) Date of Patent: Dec. 31, 2024

(54) DISPLAY APPARATUS AND METHOD OF PRODUCING THE SAME

(71) Applicant: Sony Corporation, Tokyo (JP)

(72) Inventor: Ikuhiro Yamamura, Kanagawa (JP)

(73) Assignee: Sony Group Corporation, Tokyo (JP)

( * ) Notice: Subject to any disclaimer, the term of this patent is extended or adjusted under 35 U.S.C. 154(b) by 886 days.

(21) Appl. No.: 17/268,768

(22) PCT Filed: Sep. 18, 2019

(86) PCT No.: PCT/JP2019/036559
§ 371 (c)(1),
(2) Date: Dec. 16, 2021

(87) PCT Pub. No.: WO2020/066787
PCT Pub. Date: Apr. 2, 2020

(65) Prior Publication Data
US 2022/0102452 A1    Mar. 31, 2022

(30) Foreign Application Priority Data

Sep. 28, 2018 (JP) ................ 2018-185380

(51) Int. Cl.
*H10K 59/127* (2023.01)
*H10K 59/12* (2023.01)
(Continued)

(52) U.S. Cl.
CPC ..... *H10K 59/1275* (2023.02); *H10K 59/1213* (2023.02); *H10K 59/131* (2023.02); *H10K 59/1201* (2023.02)

(58) Field of Classification Search
CPC ........... H10K 59/1275; H10K 59/1213; H10K 59/131; H10K 59/1201; H10K 71/50;
(Continued)

(56) References Cited

U.S. PATENT DOCUMENTS

| 4,829,213 A | 5/1989 | Pecile et al. |
| 2005/0001211 A1 | 1/2005 | Yamazaki et al. |

(Continued)

FOREIGN PATENT DOCUMENTS

| JP | 63-48793 A | 3/1988 |
| JP | 2004-247373 A | 9/2004 |

(Continued)

OTHER PUBLICATIONS

International Search Report (PCT/ISA/210), International Application No. PCT/JP2019/036559, dated Nov. 5, 2019.

(Continued)

*Primary Examiner* — Mohammad A Rahman
(74) *Attorney, Agent, or Firm* — Michael Best & Friedrich LLP

(57) ABSTRACT

A display apparatus includes: a first semiconductor substrate that includes a light emitting unit and a first drive circuit, the first drive circuit driving the light emitting unit; and a second semiconductor substrate that includes a second drive circuit to be electrically connected to the first drive circuit, the second semiconductor substrate being bonded to the first semiconductor substrate.

20 Claims, 13 Drawing Sheets

(51) Int. Cl.
*H10K 59/121* (2023.01)
*H10K 59/131* (2023.01)

(58) Field of Classification Search
CPC .. H10K 71/80; H10K 59/127; H01L 27/0688; H01L 25/167; H01L 27/1214
See application file for complete search history.

(56) References Cited

U.S. PATENT DOCUMENTS

| | | |
|---|---|---|
| 2017/0033226 A1 | 2/2017 | Yamazaki et al. |
| 2018/0012549 A1 | 1/2018 | Lee et al. |
| 2018/0211596 A1* | 7/2018 | Gu .................. H10K 59/1201 |

FOREIGN PATENT DOCUMENTS

| | | |
|---|---|---|
| JP | 2017-34246 A | 2/2017 |
| JP | 2018-117102 A | 7/2018 |

OTHER PUBLICATIONS

Notification of Transmittal of the International Search Report and the Written Opinion of the International Searching Authority, or the Declaration (PCT/ISA/220), International Application No. PCT/JP2019/036559, dated Nov. 19, 2019.

Written Opinion of the International Search Authority (PCT/ISA/237), International Application No. PCT/JP2019/036559, dated Nov. 19, 2019.

* cited by examiner

DISPLAY APPARATUS AND METHOD OF PRODUCING THE SAME

BACKGROUND

The present disclosure relates to a display apparatus and a method of producing the same.

In recent years, an organic electroluminescent display apparatus (hereinafter, referred to also as "organic EL display apparatus") using an organic electroluminescent device (hereinafter, referred to also as "organic EL device") has attracted attention as a display apparatus to replace a liquid crystal a display apparatus. The organic EL display apparatus includes a plurality of light emitting devices arranged in a matrix to constitute a pixel, and a plurality of pixel circuits that drives the light emitting devices in units of pixels (see, for example, Japanese Patent No. 6031954).

SUMMARY

The organic EL display apparatus needs a relatively high voltage corresponding to the light emission voltage of the light emitting device. Therefore, it is necessary to secure at least a certain length of a gate length of the transistor driving each pixel and at least a certain distance of device separation for electrically separating transistors. For this reason, it has been difficult to shorten the distance of device separation and reduce the pixel size. Alternatively, there is a problem that the area of the peripheral circuit that drives a pixel circuit increases with advancement of the display apparatus, and the panel size of the display apparatus increases.

In view of the circumstances as described above, it is desired to provide a display apparatus capable of reducing the pixel size or panel size, and a method of producing the same.

A display apparatus according to an embodiment of the present disclosure includes: a first semiconductor substrate; and a second semiconductor substrate.

The first semiconductor substrate includes a light emitting unit and a first drive circuit, the first drive circuit driving the light emitting unit.

The second semiconductor substrate includes a second drive circuit to be electrically connected to the first drive circuit, the second semiconductor substrate being bonded to the first semiconductor substrate.

With the above-mentioned display apparatus, since a circuit for driving the light emitting unit is separately formed on the first semiconductor substrate and the second semiconductor substrate, it is possible to reduce the pixel size or panel size.

The first drive circuit may be a part of the pixel circuits, and the second drive circuit may be another part of the pixel circuits.

The first drive circuit may include a transistor that switches a signal voltage or a power supply voltage, and the second drive circuit may include a transistor that controls a current flowing to the light emitting unit.

In this case, the second drive circuit may further include a transistor that resets a voltage applied to the plurality of light emitting devices.

Alternatively, the first drive circuit may include a transistor that controls a current flowing to the light emitting unit, and the second drive circuit may include a transistor that switches a signal voltage or a power supply voltage.

In this case, the first drive circuit may further include a transistor that resets a voltage applied to the plurality of light emitting devices.

The first drive circuit may include a first capacitive device, and the second drive circuit may include a second capacitive device electrically connected to the first capacitive device.

Alternatively, the second drive circuit may include a first capacitive device and a second capacitive device electrically connected to the first capacitive device.

Meanwhile, the first drive circuit may be a pixel circuit that individually drives the plurality of light emitting devices, and the second drive circuit may be a peripheral circuit that supplies a signal voltage or a power supply voltage to the pixel circuit.

The first semiconductor substrate and the second semiconductor substrate may each include a substrate body and a wiring layer, and the wiring layer of the first semiconductor substrate may be bonded to the wiring layer of the second semiconductor substrate.

Alternatively, the first semiconductor substrate and the second semiconductor substrate may each include a substrate body and a wiring layer, and the substrate body of the first semiconductor substrate may be bonded to the wiring layer of the second semiconductor substrate.

A method of producing a display apparatus according to an embodiment of the present disclosure includes:
preparing a first semiconductor substrate that includes a light emitting unit and a first drive circuit, the first drive circuit driving the light emitting unit;
preparing a second semiconductor substrate that includes a second drive circuit; and
electrically connecting the first drive circuit and the second semiconductor substrate by bonding the first semiconductor substrate and the second semiconductor substrate to each other.

These and other objects, features and advantages of the present disclosure will become more apparent in light of the following detailed description of best mode embodiments thereof, as illustrated in the accompanying drawings.

DETAILED DESCRIPTION OF EMBODIMENTS

Hereinafter, embodiments of the present disclosure will be described with reference to the drawings.

First Embodiment

[Entire Configuration]

Figure 1:
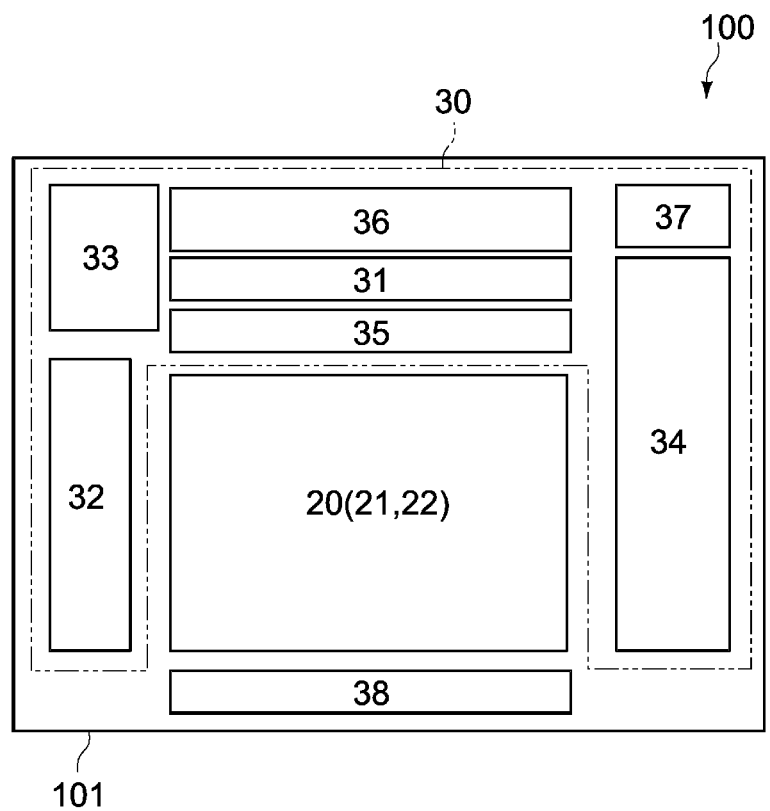
FIG. 1 is a schematic plan view showing a configuration of a display apparatus according to a first embodiment of the present disclosure.
Figure 2:
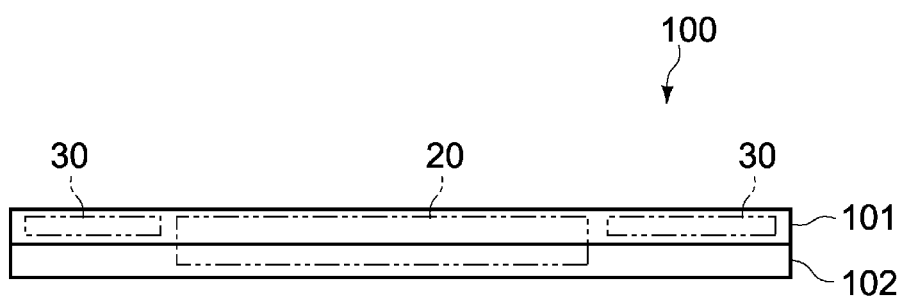
FIG. 2 is a schematic side cross-sectional view of the display apparatus.

FIG. 1 is a schematic plan view showing a configuration of a display apparatus according to a first embodiment of the present disclosure. FIG. 2 is a schematic side cross-sectional view of the display apparatus.

Hereinafter, an organic EL display apparatus will be described as an example of a display apparatus 100 according to this embodiment.

As shown in FIG. 2, the display apparatus 100 according to this embodiment includes a first semiconductor substrate 101 and a second semiconductor substrate 102. The display apparatus 100 is configured by bonding (or stacking) the first semiconductor substrate 101 and the second semiconductor substrate 102 to each other.

Each of the first semiconductor substrate 101 and the second semiconductor substrate 102 typically includes a single crystal silicon (Si) substrate. Alternatively, each of the first semiconductor substrate 101 and the second semiconductor substrate 102 includes another semiconductor substrate such as a SiC substrate.

As shown in FIG. 1, the first semiconductor substrate 101 includes a pixel area 20 and a peripheral circuit area 30. In this embodiment, as shown in FIG. 2, the pixel area 20 is formed in the first semiconductor substrate 101, and the second semiconductor substrate 102, and the peripheral circuit area 30 is formed in the first semiconductor substrate 101.

In the pixel area 20, a light emitting unit 21 constituting a pixel and a pixel circuit 22 driving the light emitting unit 21. As will be described below, the light emitting unit 21 includes a plurality of light emitting devices 210 arranged in a matrix in the horizontal direction (see FIG. 3). The pixel circuit 22 includes a plurality of pixel circuits 22 corresponding to the plurality of light emitting devices 210. Each of the pixel circuits 22 individually drives the corresponding light emitting device 210.

Meanwhile, in the peripheral circuit area 30, a peripheral circuit that supplies a signal voltage or a power supply voltage to the pixel circuit 22 is provided. Examples of the peripheral circuit typically include a horizontal scanning circuit 31, a vertical scanning circuit 32, a gamma voltage generation circuit 33, a timing controller 34, a DA converter/amplifier area 35, an interface 36, and a memory 37. As a part of the peripheral circuit, a test circuit 38 may be provided. As will be described below, the horizontal scanning circuit 31 corresponds to a scanning circuit 23 and the light-emission-control-transistor control circuit 24, and the vertical scanning circuit 32 corresponds to the an image signal output circuit 25 (see FIG. 3).

The configuration and layout of the peripheral circuits (31 to 37) arranged in the peripheral circuit area 30 are not limited to those illustrated in the example, and are arbitrarily set. The pixel circuit 22 and the peripheral circuits (31 to 37) are configured as a drive circuit that controls driving of the light emitting unit 21. The drive circuit includes a first drive circuit formed in the first semiconductor substrate 101, and a second drive circuit formed in the second semiconductor substrate 102. In this embodiment, the first drive circuit constitutes a part of the pixel circuit 22 and the peripheral circuits (31 to 37), and the second drive circuit constitutes another part of the pixel circuit 22.

Figure 3:
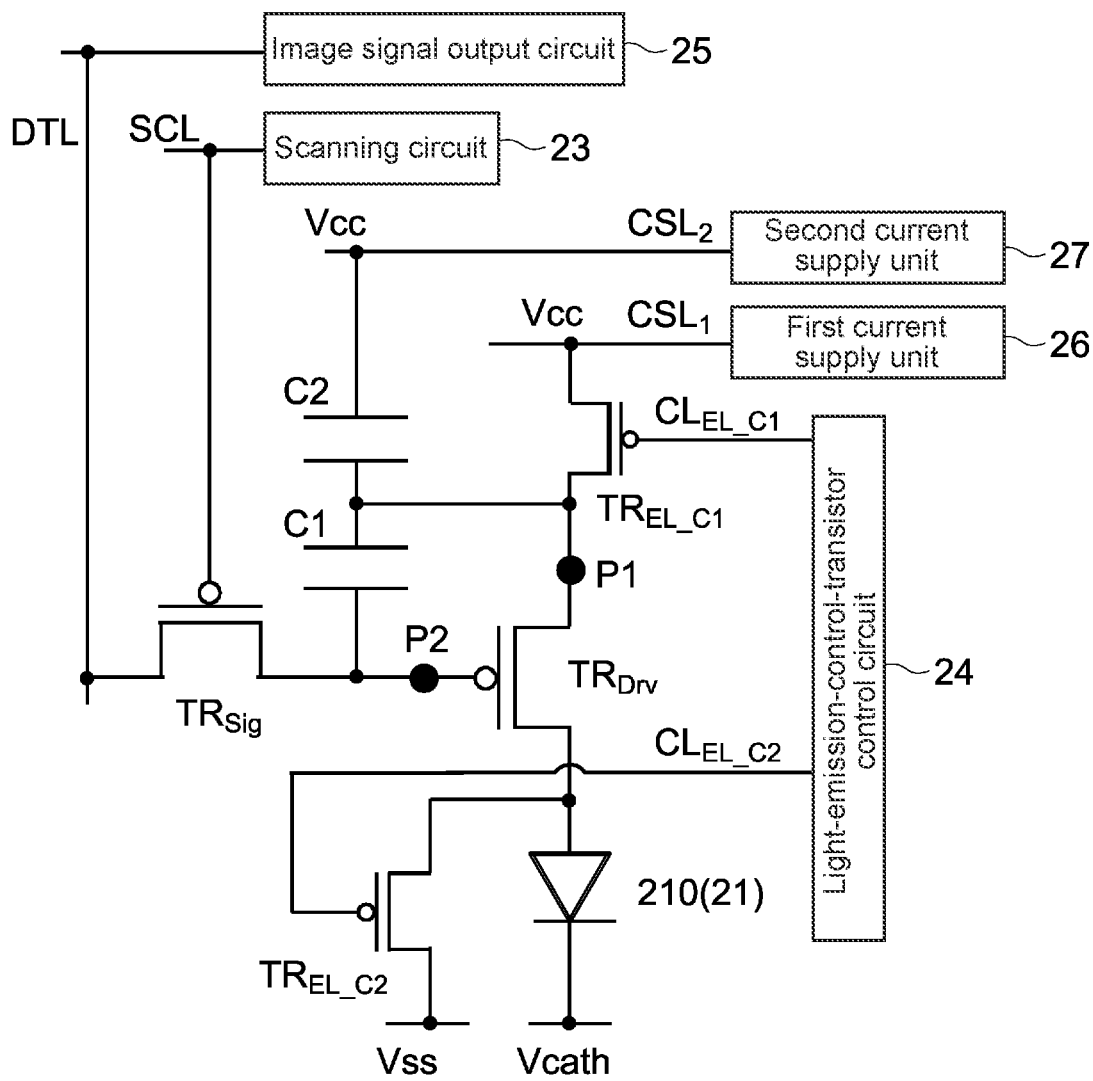
FIG. 3 is an equivalent circuit diagram showing an example of a pixel circuit in the display apparatus.

FIG. 3 is an equivalent circuit diagram showing an example of the pixel circuit 22. In this embodiment, as the pixel circuit 22, a 4Tr-2C pixel circuit including four transistors and two capacity units will be described as an example. However, the present disclosure is not limited thereto, and an appropriate pixel circuit such as a 3Tr-2C pixel circuit including three transistors and two capacity units, a 4Tr-1C pixel circuit including four transistors and one capacity unit, and a 3Tr-1C pixel circuit including three transistors and one capacity unit can be adopted.

As shown in FIG. 3, the pixel circuit 22 includes four transistors (a drive transistor $Tr_{Drv}$, an image signal writing transistor $Tr_{Sig}$, a first light-emission-control transistor $Tr_{EL\_C1}$, and a the second light-emission-control transistor $Tr_{EL\_C2}$), two capacity units (a first capacity unit C1 and a second capacity unit C2), and various signal lines (a scanning line SCL, a data line DTL, a first current supply line $CSL_1$, a second current supply line $CSL_2$, a first light emission control line $CL_{EL\_C1}$, and a second light emission control line $CL_{EL\_C2}$). The pixel circuit 22 includes a plurality of pixel circuits 22 corresponding to the plurality of light emitting devices 210 constituting the light emitting unit 21.

The drive transistor $Tr_{Drv}$ is a control transistor that controls a current flowing to the light emitting unit 21. The drive transistor $Tr_{Drv}$ includes one source/drain area to be connected to the anode of the light emitting unit 21, the other source/drain area to be connected to one source/drain area of the first light-emission-control transistor $Tr_{EL\_C1}$, and a gate to be connected to one source/drain area of the image signal writing transistor $Tr_{Sig}$ and one electrode of the first capacity unit C1.

The image signal writing transistor $Tr_{Sig}$ is a row selection transistor that switches a signal voltage. The image signal writing transistor $Tr_{Sig}$ includes the other source/drain area to be connected to the image signal output circuit 25 via the data line DTL, and a gate to be connected to the scanning circuit 23 via the scanning line SCL.

The first light-emission-control transistor $Tr_{EL\_C1}$ is a column selection transistor that switches a power supply voltage. The first light-emission-control transistor $Tr_{EL\_C1}$ includes the other source/drain area to be connected to a first current supply unit 26 via the first current supply line $CSL_1$, and a gate to be connected to the light-emission-control-transistor control circuit 24 via the first light emission control line $CL_{EL\_C1}$. A drive voltage Vcc is applied to the other source/drain area of the first light-emission-control transistor $Tr_{EL\_C1}$ from the first current supply unit 26.

The second light-emission-control transistor $Tr_{EL\_C2}$ is a transistor that resets a voltage (anode voltage) applied to the light emitting unit 21. The second light-emission-control transistor $Tr_{EL\_C2}$ includes one source/drain area to be connected to the anode of the light emitting unit 21, the other source/drain area to be connected to a reset voltage line Vss, and a gate to be connected to the light-emission-control-transistor control circuit 24 via the second light emission control line $CL_{EL\_C2}$.

The first capacity unit C1 and the second capacity unit C2 are connected in series to each other. One electrode of the first capacity unit C1 is connected to the gate of the drive transistor $Tr_{Drv}$ and the one source/drain area of the image signal writing transistor $Tr_{Sig}$. The other electrode of the first capacity unit C1 and one electrode of the second capacity unit C2 are connected to the other source/drain area of the drive transistor $Tr_{Drv}$ and the one source/drain area of the first light-emission-control transistor $Tr_{EL\_C1}$. The other electrode of the second capacity unit C2 is connected to a second current supply unit 27 via the second current supply line $CSL_2$. The drive voltage Vcc is supplied to the other electrode of the second capacity unit C2 from the second current supply unit 27.

The light emitting unit 21 is a current-driven-type self light emitting device whose light emission luminance changes in accordance with the magnitude of the supplied current. In this embodiment, the light emitting unit 21 includes an organic EL device (OLED). The light emitting unit 21 has a known configuration or structure including an anode electrode, an organic material layer, a cathode electrode, and the like. The organic material layer has a structure in which, for example, a hole transport layer, a light emitting layer, and an electron transport layer are stacked. The anode electrode is connected to the one source/drain area of the drive transistor $Tr_{Drv}$, and the one source/drain area of the second light-emission-control transistor $Tr_{EL\_C2}$. The cathode electrode is connected to a power supply line Vcath.

The display apparatus 100 may be configured to have a display area in which monochrome display or color display is performed. In the case of the configuration of color display, one pixel includes, for example, three sub-pixels (a red light emitting sub-pixel that emits red light, a green light emitting sub-pixel that emits green light, and a blue light emitting sub-pixel that emits blue light).

In this embodiment, the drive transistor $Tr_{Drv}$, the image signal writing transistor $Tr_{Sig}$, the first light-emission-control transistor $Tr_{EL\_C1}$, and the second light-emission-control transistor $Tr_{EL\_C2}$ each include a p-type channel MOSFET, and are each formed in an n-type well formed in a p-type silicon semiconductor substrate.

Note that description of the detailed operation of the pixel circuit 22 having the above-mentioned configuration is omitted because it is described in, for example, Patent Literature 1. Hereinafter, details of the embodiment of the present disclosure will be described on the basis of the above-mentioned configuration.

[Pixel Circuit]

Figure 4:
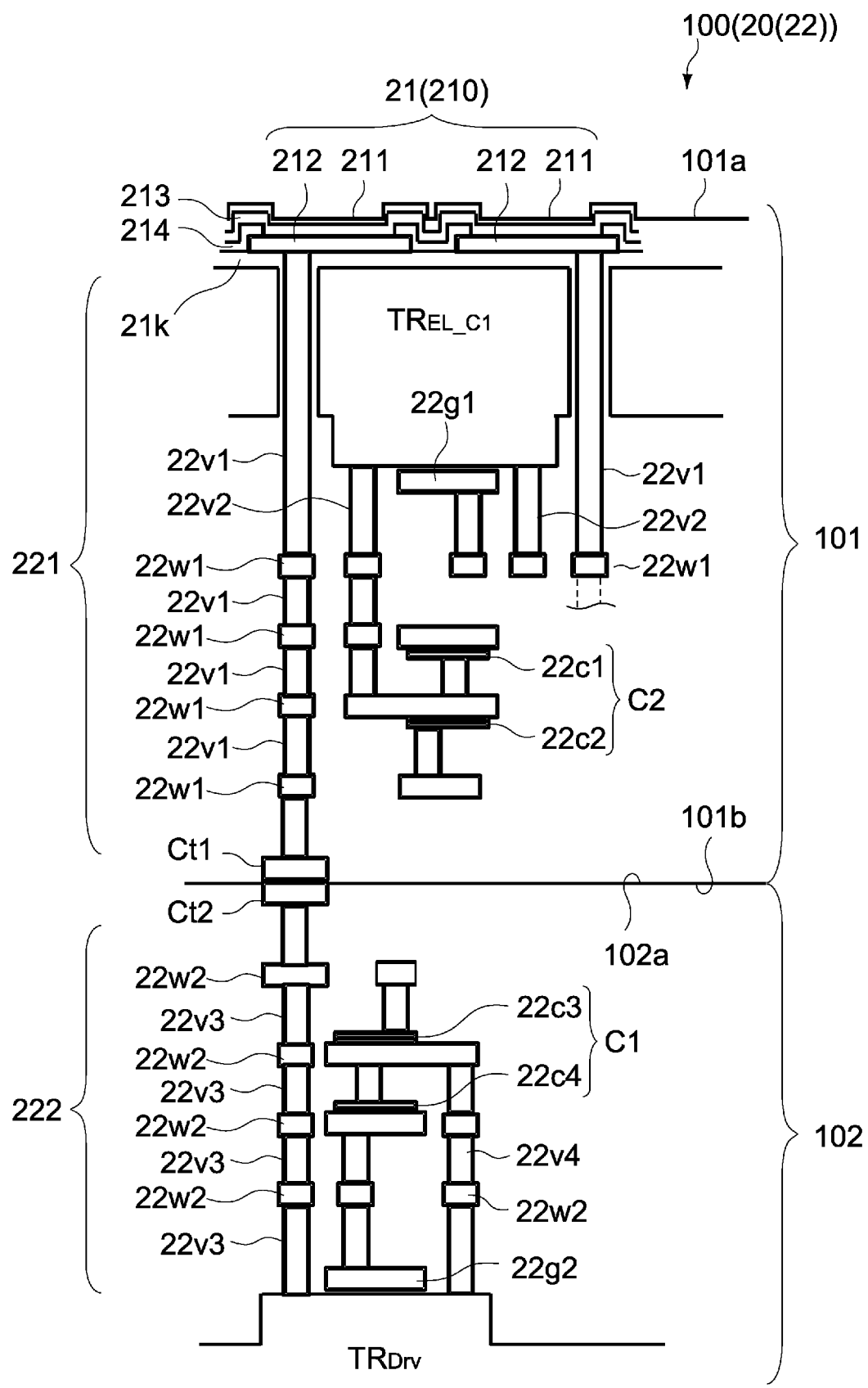
FIG. 4 is a schematic side cross-sectional view of main portions of the display apparatus showing an example of the configuration of the pixel circuit.

Subsequently, details of the pixel circuit 22 will be described. FIG. 4 is a schematic side cross-sectional view of main portions of the display apparatus 100 showing an example of the configuration of the pixel circuit 22.

As described above, the display apparatus 100 according to this embodiment includes a laminate of the first semiconductor substrate 101 and the second semiconductor substrate 102. The first semiconductor substrate 101 has a display surface 101*a* and a bonding surface 101*b*. The display surface 101*a* includes the light emitting unit 21. The bonding surface 101*b* is to be bonded to the second semiconductor substrate 102. The second semiconductor substrate 102 includes a bonding surface 102*a* to be bonded to the first semiconductor substrate 101.

The pixel circuit 22 is formed inside the first semiconductor substrate 101 and the second semiconductor substrate 102. More specifically, the pixel circuit 22 includes a first pixel circuit 221 formed inside the first semiconductor substrate 101, and a second pixel circuit 222 formed inside the second semiconductor substrate 102. The first pixel circuit 221 is a part of the pixel circuit 22, and the second pixel circuit 222 is another part of the pixel circuit 22. The first pixel circuit 221 and the second pixel circuit 222 are electrically connected to each other when the first semiconductor substrate 101 and the second semiconductor substrate 102 are stacked, thereby forming the pixel circuit 22.

The first pixel circuit 221 constitutes a first drive circuit that drives a light emitting unit 210, and the second pixel circuit 222 constitutes a second drive circuit that drives the light emitting unit 210. At least one of the four transistors ($Tr_{Drv}$, $Tr_{Sig}$, $Tr_{EL\_C1}$, $Tr_{EL\_C2}$) of the pixel circuit 22 described with reference to FIG. 3 is formed in the first pixel circuit 221, and the other transistor(s) is/are formed in the second pixel circuit 222. Similarly, at least one of the two capacity units (C1 and C2) constituting the pixel circuit 22 are formed in the first pixel circuit 221 or the second pixel circuit 222.

The transistors formed in the first pixel circuit 221 and the second pixel circuit 222 are not particularly limited. In this embodiment, the image signal writing transistor $Tr_{Sig}$ and the first light-emission-control transistor $Tr_{EL\_C1}$ are formed in the first pixel circuit 221, and the drive transistor $Tr_{Drv}$ and the second light-emission-control transistor $Tr_{EL\_C2}$ are formed in the second pixel circuit 222 (see FIG. 4).

As shown in FIG. 4, the first pixel circuit 221 includes a plurality of vias 22*v*1 and 22*v*2 as interlayer connection portions, a plurality of wiring layers 22*w*1, and a the capacitive devices 22*c*1 and 22*c*2.

The vias 22*v*1 are electrically connected to an anode electrode 212 of the light emitting unit 21, and pass through the first semiconductor substrate 101 in the thickness direction via the plurality of wiring layers 22*w*1 or are routed.

The vias 22*v*2 are connected to a gate electrode 22*g*1 of the transistor (the first light-emission-control transistor $Tr_{EL\_C1}$ in the illustrated example) and the respective source/drain areas.

The capacitive devices 22*c*1 and 22*c*2 respectively include a laminated of a pair of electrodes and a dielectric film interposed between the pair of electrodes, and are connected in series to each other to constitute the second capacity unit C2. Note that it is unnecessary to provide a plurality of capacitive devices 22*c*1 and 22*c*2, and the number of capacitive devices may be one.

Meanwhile, the second pixel circuit 222 includes a plurality of vias 22*v*3 and 22*v*4 as interlayer connection portions, a plurality of wiring layers 22*w*2, and capacitive devices 22*c*3 and 22*c*4.

The vias 22v3 pass through the first semiconductor substrate 101 in the thickness direction via the plurality of wiring layers 22w1 or are routed. The vias 22v3 are electrically connected between the one source/drain area of the transistor (the drive transistor $Tr_{Drv}$ in the illustrated example) and the vias 22v1 of the first pixel circuit 221.

The vias 22v4 are connected to a gate electrode of the drive transistor $Tr_{Drv}$ and the other source/drain area.

The capacitive devices 22c3 and 22c4 respectively include a laminated of a pair of electrodes and a dielectric film interposed between the pair of electrodes, and are connected in series to each other to constitute the first capacity unit C1. Note that it is unnecessary to provide a plurality of capacitive devices 22c3 and 22c4, and the number of capacitive devices may be one.

In the connection area between the vias 22v1 and 22v3, the connection points Ct1 and Ct2 for achieving favorable electrical connection are provided. One connection point Ct1 is provided on the bonding surface 101b of the first semiconductor substrate 101, and the other connection point Ct2 is provided on the bonding surface 102a of the second semiconductor substrate 102. The connection points Ct1 and Ct2 are respectively formed on the same planes as those of the bonding surfaces 101b and 102a, and connected to each other simultaneously with the bonding of the bonding surfaces 101b and 102a.

The method of bonding the bonding surfaces 101b and 102a is not particularly limited. Typically, a direct bonding method is adopted. As a result, it is possible to integrally bond the first semiconductor substrate 101 and the second semiconductor substrate 102 without interposing an adhesive at the interface.

Examples of the direct bonding include plasma bonding. In the plasma bonding, by forming a silicon-oxygen covalent bond or a silicon-silicon bond between the bonding surface 101b and the bonding surface 102a, the bonding surfaces 101b and 102a are firmly fixed. As the direct bonding, not only the plasma bonding but also a solid-phase boding method such as diffusion bonding may be adopted.

[Method of Producing Display Apparatus]

The display apparatus 100 configured as described above is prepared by bonding (stacking) the first semiconductor substrate 101 and the second semiconductor substrate 102 via the bonding surfaces 101b and 102a, respectively. FIG. 5A to FIG. 5D are each a schematic diagram describing a method of producing the display apparatus 100.

Figure 5A:
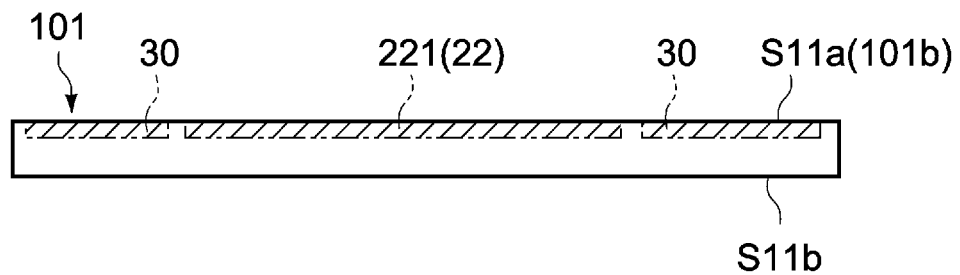
FIG. 5A is a schematic diagram describing a method of producing the display apparatus.

As shown in FIG. 5A, the first semiconductor substrate 101 including the light emitting unit 21, the first pixel circuit 221, and the peripheral circuit area 30 is prepared.

Figure 5B:
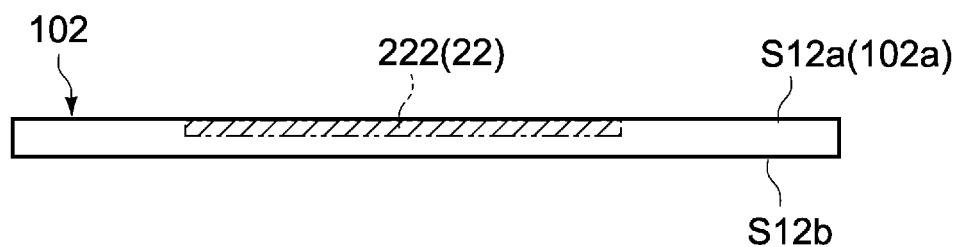
FIG. 5B is a schematic diagram describing a method of producing the display apparatus.

Meanwhile, as shown in FIG. 5B, the second semiconductor substrate 102 including the second pixel circuit 222 is prepared.

The connection points Ct1 and Ct2 (see FIG. 4) are respectively formed on a surface S11a of the first semiconductor substrate 101 and a surface S12a of the second semiconductor substrate 102.

Figure 5C:
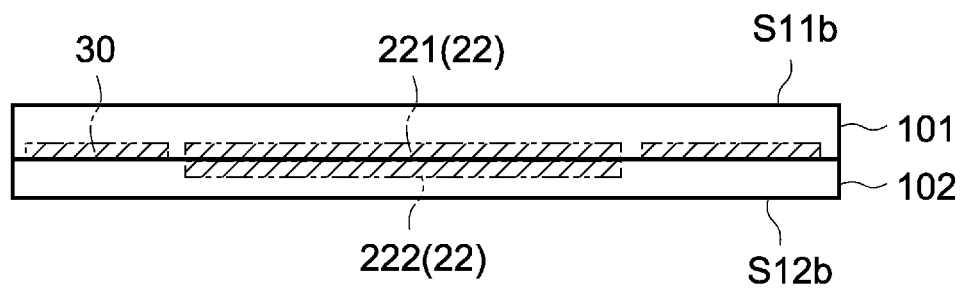
FIG. 5C is a schematic diagram describing a method of producing the display apparatus.

Subsequently, as shown in FIG. 5C, the upper and lower sides of the first semiconductor substrate 101 are reversed, and the surface S11a is bonded to the surface S12a of the second semiconductor substrate 102. For bonding, for example, a direct bonding method such as a plasma bonding method is adopted. As a result, the first semiconductor substrate 101 and the second semiconductor substrate 102 are integrated, and the first pixel circuit 221 and the second pixel circuit 222 are electrically connected to each other via the connection points Ct1 and Ct2.

Figure 5D:
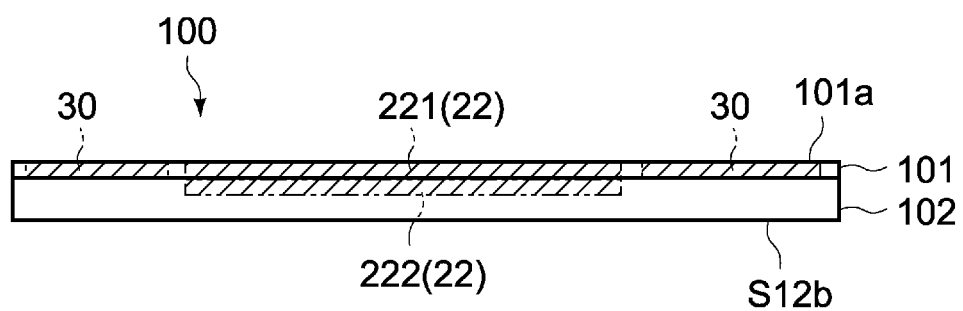
FIG. 5D is a schematic diagram describing a method of producing the display apparatus.

Subsequently, as shown in FIG. 5D, a back surface S11b of the first semiconductor substrate 101 is polished to thin the first semiconductor substrate 101. Further, after forming, in the first semiconductor substrate 101, interlayer connection portions (vias 22v1) for electrically connecting the light emitting unit 21 and the second pixel circuit 222, the light emitting unit 21 is formed on the first semiconductor substrate 101 via an insulation film 21k (see FIG. 4). As a result, the display surface 101a of the display apparatus 100 is prepared.

Note that as necessary, also a back surface S12b of the second semiconductor substrate 102 may be thinned. Further, as the first semiconductor substrate 101, a silicon-on-insulator (SOI) substrate in which two silicon substrates are stacked with an insulation layer sandwiched therebetween may be adopted instead of a single silicon substrate.

[Effect]

As described above, in the display apparatus 100 according to this embodiment, the surface of the first semiconductor substrate 101 including the first pixel circuit 221 and the surface of the second semiconductor substrate 102 including the second pixel circuit 222 are bonded to each other to constitute the pixel circuit 22. By forming the pixel circuit 22 of originally-separated substrates, i.e., the first semiconductor substrate 101 and the second semiconductor substrate 102, the area necessary for forming the pixel circuit 22 is expanded in the thickness direction of the display apparatus 100. Therefore, it is possible to reduce the area of the pixel area 20 occupying the display surface 101a.

In particular, the organic EL display apparatus needs a relatively high voltage (Vcc) corresponding to the light emission voltage of the light emitting device. Therefore, it is necessary to secure at least a certain length of a gate length of the transistor driving each pixel and at least a certain distance of device separation for electrically separating transistors. In this embodiment, the pixel circuit 22 can be three-dimensionally routed in the thickness region of the two semiconductor substrates. Therefore, it is easy to secure at least a certain length of a gate length of the transistor and at least a certain distance of device separation. As a result, also in the display apparatus that needs a relatively high voltage, it is possible to reduce the pixel size while securing desired withstand voltage characteristics.

Second Embodiment

Figure 6:
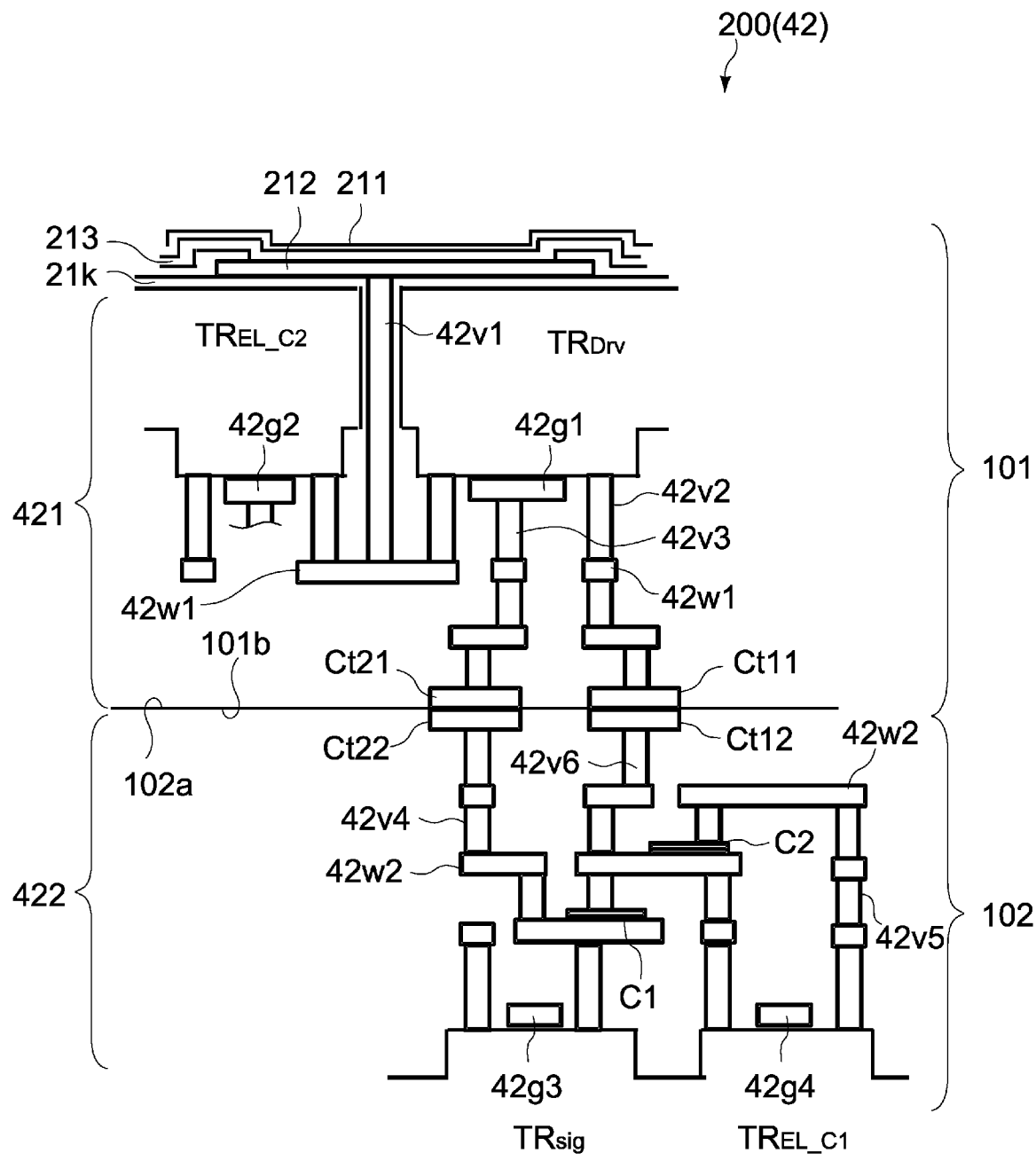
FIG. 6 is a schematic side cross-sectional view of main portions of a display apparatus according to a second embodiment of the present disclosure.

FIG. 6 is a schematic side cross-sectional view of main portions of a display apparatus 200 according to a second embodiment of the present disclosure.

Hereinafter, configurations different from those in the first embodiment will be mainly described, configurations similar to those in the first embodiment will be denoted by the same reference symbols, and description thereof will be omitted or simplified.

The display apparatus 200 according to this embodiment has a stacked structure of the first semiconductor substrate 101 and the second semiconductor substrate 102. A pixel circuit 420 that drives the light emitting unit 21 (light emitting device 210) includes a first pixel circuit 421 formed in the first semiconductor substrate 101, and a second pixel circuit 422 formed in the second semiconductor substrate 102. Similarly to the case of the first embodiment, the peripheral circuit area 30 is formed in the first semiconductor substrate 101 (see FIG. 1).

In this embodiment, the configurations of the first pixel circuit 421 and the second pixel circuit 422 are different from those in the first embodiment. Specifically, in this embodiment, the drive transistor $Tr_{Drv}$ and the second light-emission-control transistor $Tr_{EL\_C2}$ are formed in the first pixel circuit 421, and the image signal writing transistor $Tr_{Sig}$ and the first light-emission-control transistor $Tr_{EL\_C1}$ are formed in in the second pixel circuit 222 (see FIG. 6). Note that a pixel circuit 42 is represented by an equivalent circuit similar to the pixel circuit 22 in the first embodiment (see FIG. 3).

As shown in FIG. 6, the first pixel circuit 421 includes a plurality of vias 42v1, 42v2, and 42v3 as interlayer connection portions, and a plurality of wiring layers w1.

The via 42v1 connects, via the wiring layer 42w1, the anode electrode 212 of the light emitting unit 21 and the one source/drain area of each of the drive transistor $Tr_{Drv}$ and the second light-emission-control transistor $Tr_{EL\_C2}$.

The via 42v2 connects, via the plurality of wiring layers 42w1, the other source/drain area of the drive transistor $Tr_{Drv}$ and a connection point Ct11 on the bonding surface 101b.

The via 42v3 connects, via the plurality of wiring layers 42w1, a gate electrode 42g1 of the drive transistor $Tr_{Drv}$ and a connection point Ct21 on the bonding surface 101b.

Note that in FIG. 6, the reference symbol 42g2 indicates the gate electrode of the second light-emission-control transistor $Tr_{EL\_C2}$.

Meanwhile, the second pixel circuit 422 includes a plurality of vias 42v4, 42v5, and 42v6 as interlayer connection portions, a plurality of wiring layers 42w2, the first capacity unit C1, and the second capacity unit C2.

The via 42v4 connects, via the plurality of wiring layers 42w2, the one source/drain area of the image signal writing transistor $Tr_{Sig}$ and a connection point Ct22 on the bonding surface 102a.

The via 42v5 connects, via the plurality of wiring layers 42w2, the one source/drain area of the first light-emission-control transistor $Tr_{EL\_C1}$ and the second capacity unit C2.

The via 42v6 connects, via the plurality of wiring layers 42w2, the first capacity unit C1 and the second capacity unit C2, and a connection point Ct12 on the bonding surface 102a.

The first capacity unit C1 and the second capacity unit C2 each include a laminate of a pair or electrodes and a dielectric film interposed between the pair of electrodes.

Note that in FIG. 6, the reference symbols 42g3 and 42g4 respectively indicated gate electrodes of the image signal writing transistor $Tr_{Sig}$ and the first light-emission-control transistor $Tr_{EL\_C1}$.

When the bonding surface 101b of the first semiconductor substrate 101 and the bonding surface 102a of the second semiconductor substrate 102 are bonded to each other, the connection point Ct12 is electrically connected to the connection point Ct11, and the connection point Ct22 is electrically connected to the connection point Ct21. The connection points Ct11 and Ct12 correspond to a node P1 in FIG. 3, and the connection points Ct21 and Ct22 correspond to a node P2 in FIG. 3.

The display apparatus 200 according to this embodiment configured as described above is prepared by the same way as that in the first embodiment. Also in this embodiment, the first semiconductor substrate 101 may include an SOI substrate.

Also in the display apparatus 200 according to this embodiment, the operation and effect similar to those in the above-mentioned first embodiment can be achieved.

In accordance with this embodiment, the peripheral circuit area 30 to which a relatively high voltage is applied, the drive transistor $Tr_{Drv}$, and the second light-emission-control transistor $Tr_{EL\_C2}$ are formed in the first semiconductor substrate 101. Therefore, it is possible to form the image signal writing transistor $Tr_{Sig}$ and the first light-emission-control transistor $Tr_{EL\_C1}$ to be formed in the second semiconductor substrate 102 by a process of lower voltage as compared with the device to be formed in the first semiconductor substrate 101. That is, as compared with the case where there are a device that needs to have a high isolation voltage in accordance with the device area and a device that does not need to have a high isolation voltage in accordance with the device area, it is possible to suppress the increase in the number of processes due to the difference in thickness of the insulation film, and improve the yield.

Third Embodiment

Figure 7:
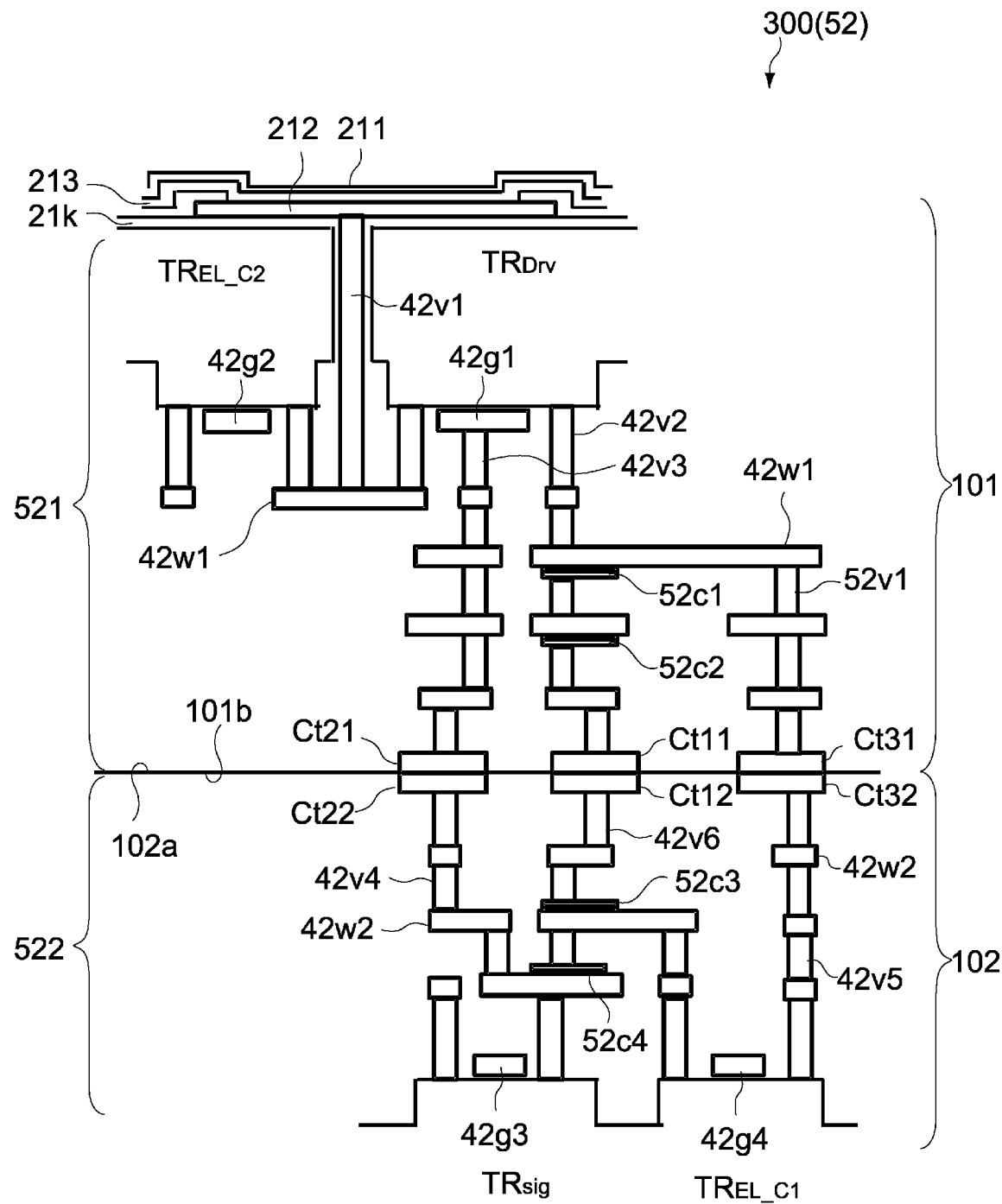
FIG. 7 is a schematic side cross-sectional view of main portions of a display apparatus according to a third embodiment of the present disclosure.

FIG. 7 is a schematic side cross-sectional view of main portions of a display apparatus 300 according to a third embodiment of the present disclosure.

Hereinafter, configurations different from those in the second embodiment will be mainly described, configurations similar to those in the second embodiment will be denoted by the same reference symbols, and description thereof will be omitted or simplified.

The display apparatus 300 according to this embodiment is different from the display apparatus 200 according to the second embodiment in that it is formed of two originally-separated substrates, i.e., the first semiconductor substrate 101 and the second semiconductor substrate 102, and the first current supply unit 26 and the second current supply unit 27 (see FIG. 3) includes a common current supply unit. In this embodiment, as shown in FIG. 7, a first pixel circuit 521 formed in the first semiconductor substrate 101 further includes capacitive devices 52c1 and 52c2 a via 52v1.

The capacitive devices 52c1 and 52c2 are formed in the via 42v2 to be connected to the other source/drain area of the drive transistor $Tr_{Drv}$. The capacitive devices 52c1 and 52c2 each include a laminate of a pair of electrodes and a dielectric film interposed between the pair of electrodes, and are connected in series to each other to constitute the second capacity unit C2 (see FIG. 3).

The via 52v1 is branched from the via 42v2 in parallel with the capacitive devices 52c1 and 52c2. The via 52v1 connects the other source/drain area of the drive transistor $Tr_{Drv}$ and a connection point Ct31 on the bonding surface 101b.

Meanwhile, a second pixel circuit 522 formed in the second semiconductor substrate 102 includes the capacitive devices 52c3 and 52c4, and the configurations of the vias 42v5 and 42v6 are different from those in the second embodiment.

The capacitive devices 52c3 and 52c4 are connected in series to the via 42v6. The capacitive devices 52c3 and 52c4 each include a laminate of a pair of electrodes and a dielectric film interposed between the pair of electrodes, and are connected in series to each other to constitute the first capacity unit C1 (see FIG. 3).

The via 42v5 connects the one source/drain area of the first light-emission-control transistor $Tr_{EL\_C1}$ and a connection point Ct32 on the bonding surface 102a.

The via 42v6 connects the capacitive device 52c3 and the connection point Ct12 on the bonding surface 102a.

When the bonding surface 101b of the first semiconductor substrate 101 and the bonding surface 102a of the second semiconductor substrate 102 are bonded to each other, the connection point Ct12, the connection point Ct22, and the connection point Ct32 are electrically connected to the connection point Ct11, the connection point Ct21, and the connection point Ct31, respectively.

The display apparatus 300 according to this embodiment configured as described above is prepared by the same way as that in the first embodiment. Also in this embodiment, the first semiconductor substrate 101 may include an SOI substrate.

Also in the display apparatus 300 according to this embodiment, the operation and effect similar to those in the above-mentioned first embodiment can be achieved.

In accordance with this embodiment, since the first capacity unit C1 and the second capacity unit C2 are separately formed in the first semiconductor substrate 101 and the second semiconductor substrate 102, respectively, it is possible to reduce the area occupied by the capacity unit as compared with the case of forming a plurality of capacity units in the plane. As a result, it is possible to reduce the area of the pixel area to reduce the pixel size, and easily secure the capacity necessary for the capacity unit.

Further, since the capacity units are formed separately in the plurality of capacitive devices, it is possible to reduce the electrode area of each capacity unit. This has the advantage that the pixel size can be further easily reduced.

Fourth Embodiment

Figure 8:
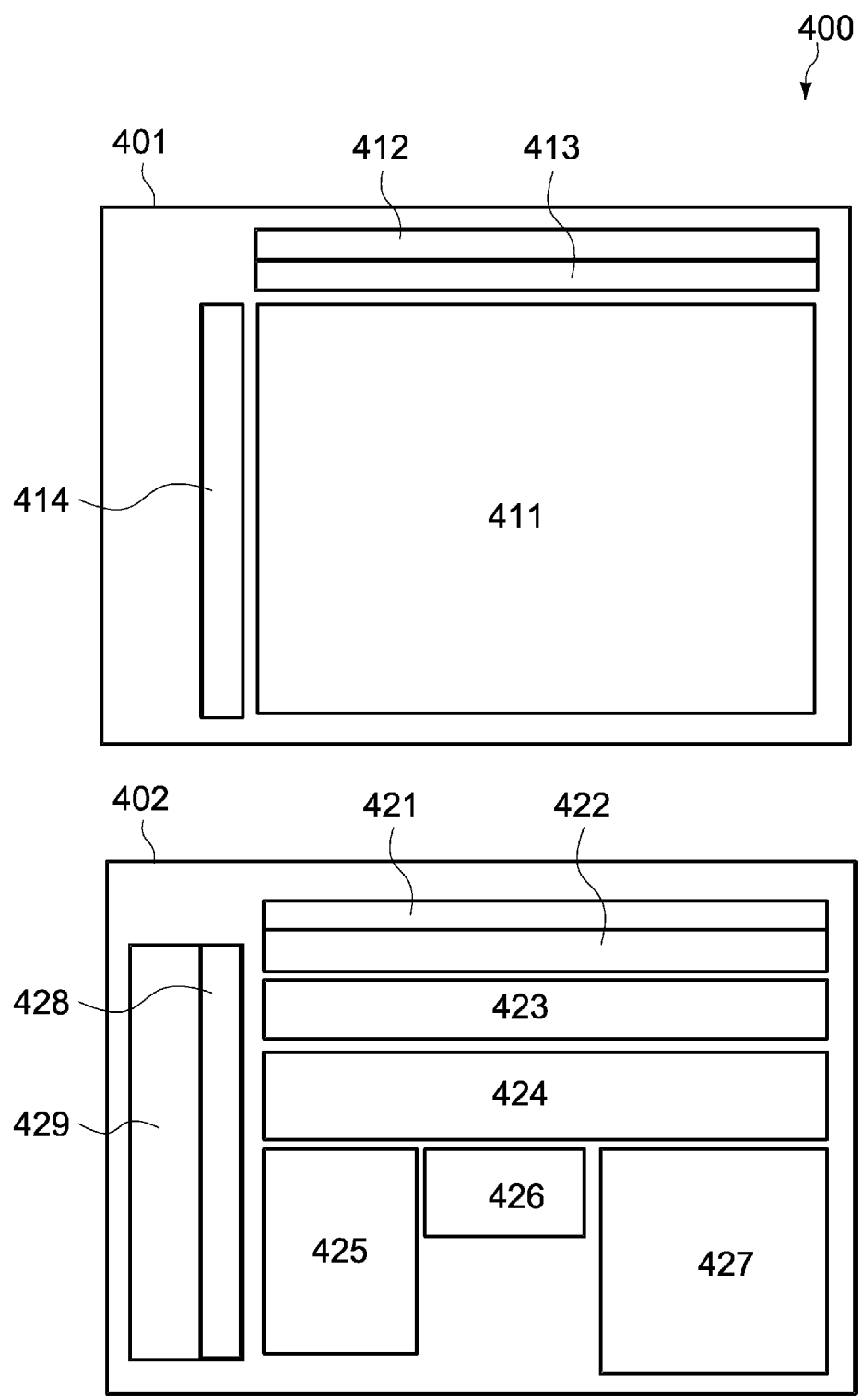
FIG. 8 is a schematic side cross-sectional view of main portions of a display apparatus according to a fourth embodiment of the present disclosure.

Subsequently, a fourth embodiment of the present disclosure will be described. FIG. 8 is a schematic side cross-sectional view of main portions of a display apparatus 400 according to a fourth embodiment of the present disclosure.

As shown in FIG. 8, the display apparatus 400 according to this embodiment includes a first semiconductor substrate 401 and a second semiconductor substrate 402, and is configured by bonding (or stacking) the first semiconductor substrate 401 and the second semiconductor substrate 402 to each other. Each of the first semiconductor substrate 401 and the second semiconductor substrate 402 typically includes a single crystal silicon (Si) substrate.

In this embodiment, the first semiconductor substrate 401 mainly includes a panel-side chip on which a pixel circuit is to be formed, and the second semiconductor substrate 402 mainly includes a circuit-side chip on which a peripheral circuit is to be formed.

The first semiconductor substrate 401 includes a pixel area 411, an interface area 412, connection areas 413 and 414 for connecting to the second semiconductor substrate 402, and the like. The interface area 412 includes an input/output pad. In the pixel area 411, light emitting units (light emitting devices) are arranged in matrix for each pixel.

The second semiconductor substrate 402 includes connection areas 421 and 428 for connecting to the first semiconductor substrate 401, a DA converter/amplifier area 422, a horizontal direction scanning circuit 423, an interface 424, a gamma voltage generation circuit 425, a memory 426, a timing controller 427, a vertical direction scanning circuit 429, and the like.

Since the above-mentioned areas, circuits, and the like formed in the first semiconductor substrate 401 and the second semiconductor substrate 402 are similar to those in the first embodiment, description thereof is omitted. Further, the layout of the areas, circuits, and the like is not limited to the form shown in FIG. 8, and can be arbitrarily set.

In accordance with the display apparatus 400 according to this embodiment, since the pixel area and the peripheral circuit area are separately formed in the first semiconductor substrate 401 and the second semiconductor substrate 402, respectively, it is possible to lay out the above-mentioned areas so as to overlap in the thickness direction of the display apparatus 400. This makes it easy to reduce the panel size.

Subsequently, the electrical connection structure of the first semiconductor substrate 401 and the second semiconductor substrate 402 will be described. The following description can be applied similarly to the display apparatuses according to the above-mentioned first to third embodiments.

Figure 9A:
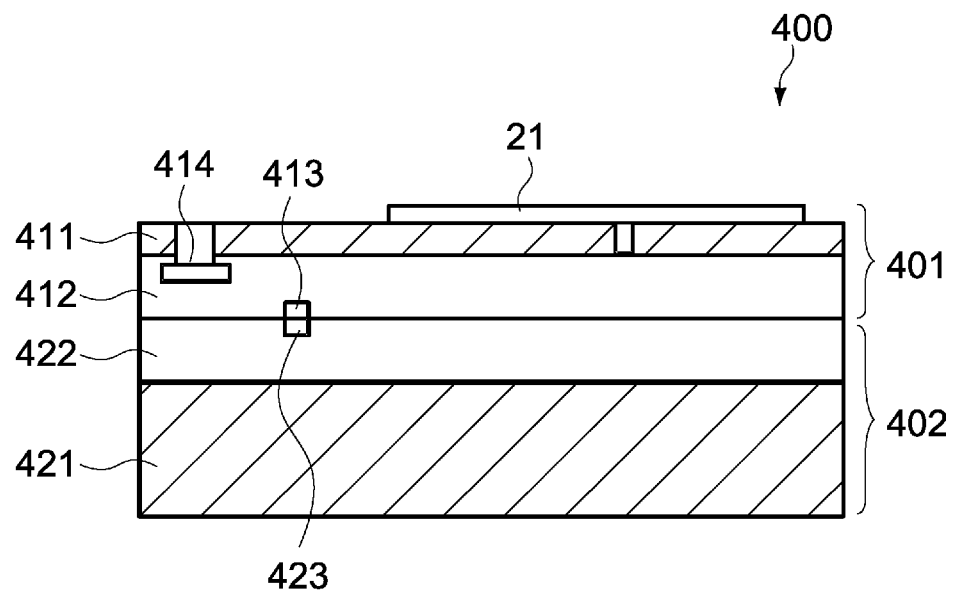
FIG. 9A is a schematic side cross-sectional view showing an example of an electrical connection structure between a first semiconductor substrate and a second semiconductor substrate in the display apparatus.
Figure 9B:
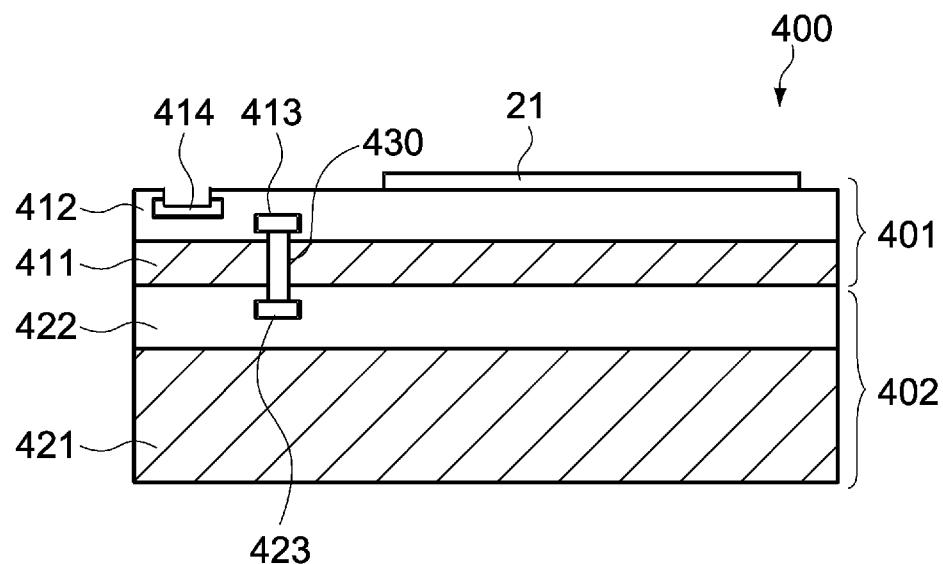
FIG. 9B is a schematic side cross-sectional view showing an example of the electrical connection structure between the first semiconductor substrate and the second semiconductor substrate in the display apparatus.

FIG. 9A and FIG. 9B are each a schematic side cross-sectional view showing an example of the electrical connection structure between the first semiconductor substrate 401 and the second semiconductor substrate 402. As shown in each figure, the first semiconductor substrate 401 includes a substrate body 411, and a wiring layer 412 in which a pixel circuit and the like are to be formed. Similarly, the second semiconductor substrate 402 includes a substrate body 421, and a wiring layer 422 in which a peripheral circuit and the like are to be formed. FIG. 9A shows the form in which the wiring layer 412 of the first semiconductor substrate 401 is bonded to the wiring layer 422 of the second semiconductor substrate 402. FIG. 9B shows the form in which the substrate body 411 of the first semiconductor substrate 401 is bonded to the wiring layer 422 of the second semiconductor substrate 402.

In the display apparatus 400 shown in FIG. 9A, a connection point 413 is formed on the surface of the wiring layer 412 of the first semiconductor substrate 401, and a connection point 423 is formed on the surface of the second semiconductor substrate 402. In this example, the connection points 413 and 423 are configured to be electrically connected to each other simultaneously with the bonding of the first semiconductor substrate 401 and the second semiconductor substrate 402.

Meanwhile, in the display apparatus 400 shown in FIG. 9B, a via (connection hole) 430 that penetrates the substrate body 411 of the first semiconductor substrate 401 is formed between the connection point 413 formed in the wiring layer 412 of the first semiconductor substrate 401 and the connection point 423 formed in the wiring layer 422 of the second semiconductor substrate 402. Also in this example, the connection points 413 and 423 are connected to each other when the first semiconductor substrate 401 and the second semiconductor substrate 402 are bonded to each other. Alternatively, after bonding the first semiconductor substrate 401 and the second semiconductor substrate 402 to each other, the via 430 and the connection point 413 may be formed.

As shown in FIG. 9A and FIG. 9B, the light emitting unit 21 is formed on the top surface of the first semiconductor substrate 401. Further, a control unit (not shown), an external terminal 414 to be connected to an external device or the like, and the like are provided on the top surface of the first semiconductor substrate 401.

In this embodiment, the connection points 413 and 423 are provided outside the pixel area (area in which the light emitting unit 21 is formed). However, the present disclosure is not limited thereto, and the connection points 413 and 423 may be provided immediately below the pixel area (on the central side of the panel). Also the number of the connection points 413 and 423 is not limited. A plurality of connection points 413 and a plurality of connection points 423 may be arranged on the corresponding substrate.

Figure 10:
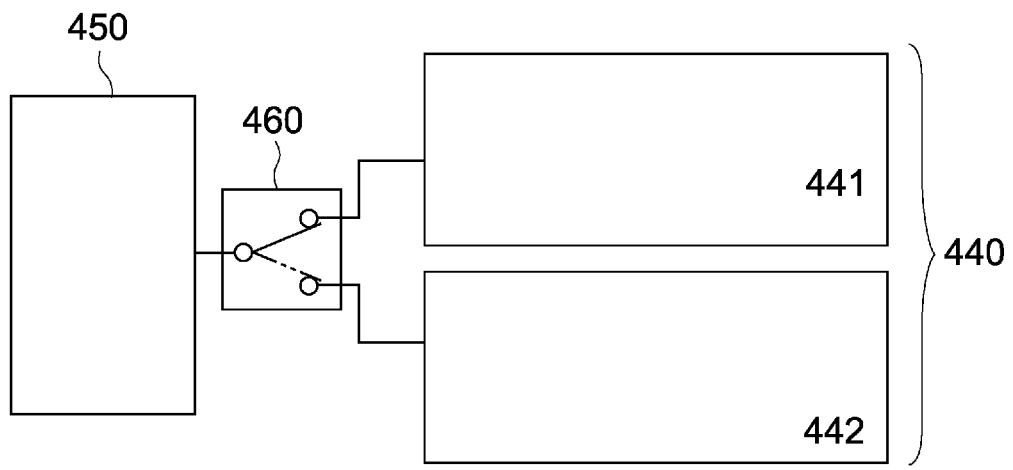
FIG. 10 is a conceptual diagram describing a modified example of a configuration of the display apparatus.

Further, as shown in FIG. 10, a pixel area (pixel circuit) 440 may be divided into two areas 441 and 442 in the vertical direction, and a switch 460 may switch supply of an image signal or an voltage signal from a peripheral circuit 450 to each of the areas 441 and 442. In this case, the switch 460 may include the above-mentioned connection points 413 and 423, or may be separately provided in the vicinity of the connection points 413 and 423.

Figure 11:
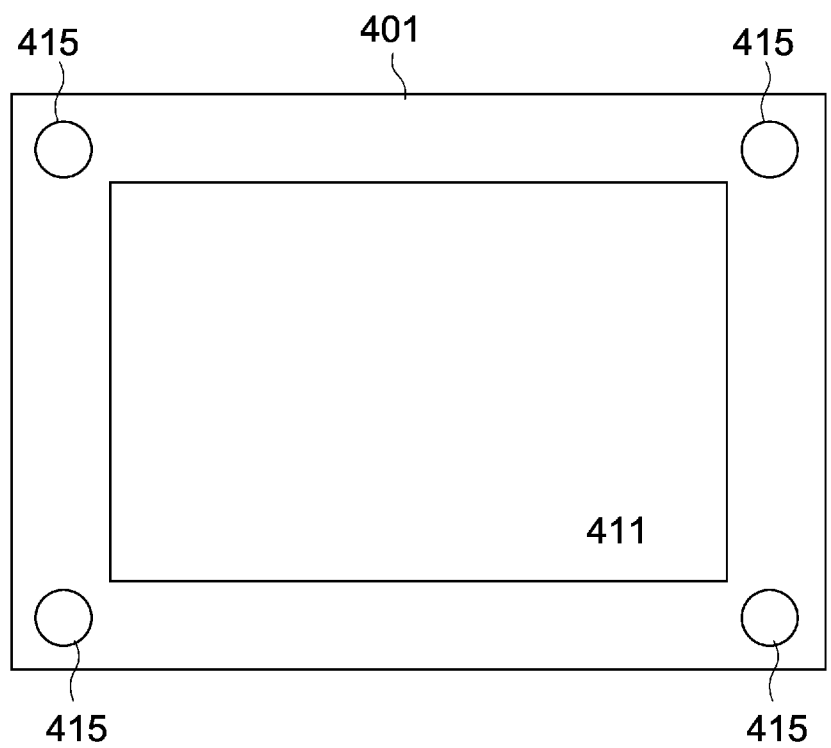
FIG. 11 is a schematic front view describing a modified example of a configuration of the display apparatus.

Further, in accordance with this embodiment, since the pixel area and the peripheral circuit area are formed in different semiconductor substrates, it is possible to form, on the same panel, a circuit area other than the pixel area and the peripheral circuit area. For example, as schematically shown in FIG. 11, in the first semiconductor substrate 401, one or more pixels 415 of an image sensor may be arranged around the pixel area 411, and a drive circuit that drives the pixel 415 may be disposed on the second semiconductor substrate 402. In this case, for example, it can be applied to pupil position detection of a user in a head-mounted display.

Alternatively, a different circuit other than the peripheral circuit may be disposed on the second semiconductor substrate 402. Examples of the different circuit include a super-resolution circuit that increase the resolution of an input image for output, and a circuit for wireless communication with an external device. As a result, the display apparatus can be sophisticated and multifunctional.

[Embodiment of Electronic Apparatus]

The organic EL display apparatus according to an embodiment of the present disclosure is incorporated in, for example, various electronic apparatuses according to application examples 1 to 6 described below. Note that the application examples are not limited thereto. The organic EL display apparatus is applicable to, for example, electronic apparatuses such as a portable information terminal, a smartphone, a portable music player, a game machine, an electronic book, various display units in an electronic dictionary, and an electronic view finder.

Since the organic EL display apparatus according to an embodiment of the present disclosure has stable display quality and can achieve high definition even in the case where it is miniaturized as described above, it is possible to provide an image with high image quality to a user of an electronic apparatus in which such an organic EL display apparatus is incorporated.

APPLICATION EXAMPLE 1

Figure 12:
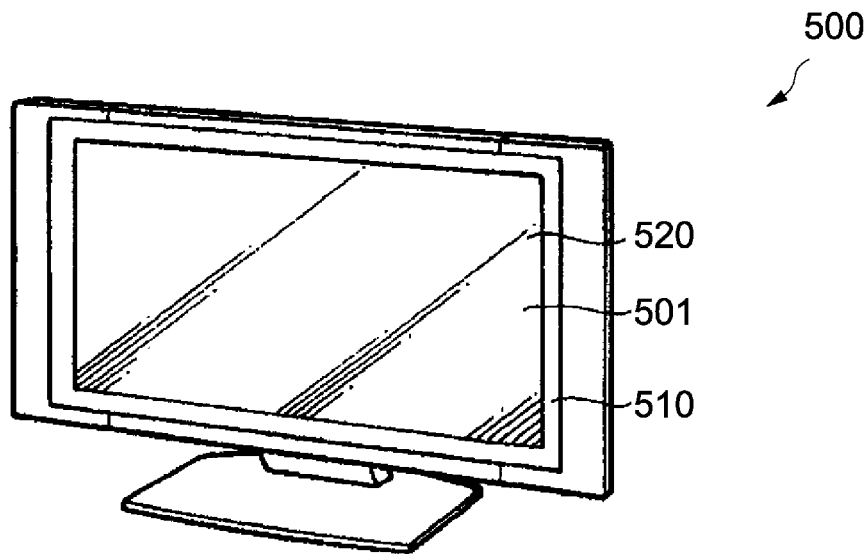
FIG. 12 is a diagram showing an appearance of a television apparatus as an electronic apparatus.

FIG. 12 shows an appearance of a television apparatus 500 as an electronic apparatus. This television apparatus includes, for example, a video display screen unit 501. The video display screen unit 501 includes a front panel 510 and a filter glass 520. The video display screen unit 501 includes the display apparatus according to any of the above-mentioned embodiments.

APPLICATION EXAMPLE 2

Figure 13:
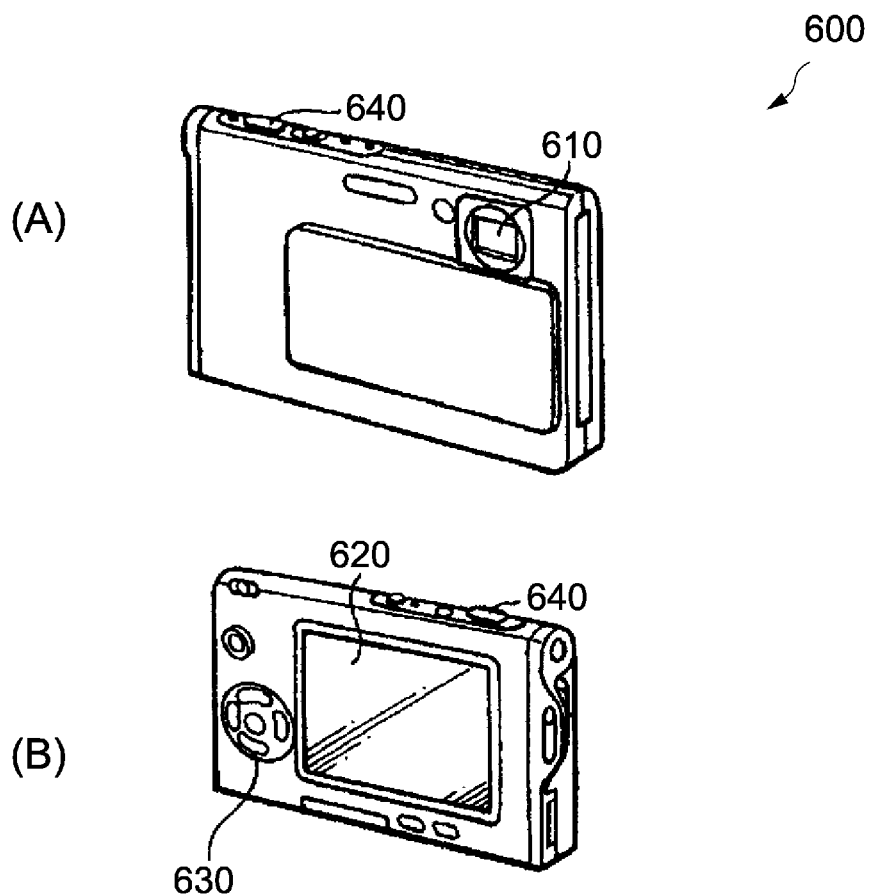
FIG. 13 is a diagram showing an appearance of a digital camera as an electronic apparatus.

FIG. 13 shows an appearance of a digital camera 600 as an electronic apparatus. This digital camera includes, for example, a light emitting unit 610 for flash, a display unit 620, a menu switch 630, and a shutter button 640. The display unit 620 includes the display apparatus according to any of the above-mentioned embodiments.

APPLICATION EXAMPLE 3

Figure 14:
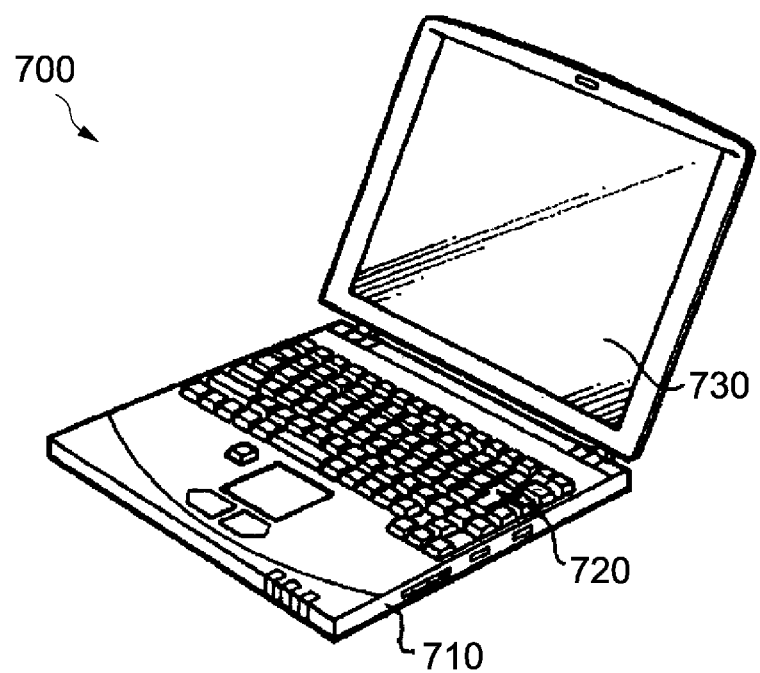
FIG. 14 is a diagram showing an appearance of a laptop personal computer as an electronic apparatus.

FIG. 14 shows an appearance of a laptop personal computer 700 as an electronic apparatus. This laptop personal computer includes, for example, a main body 710, a keyboard 720 for an input operation of characters or the like, and a display unit 730 for displaying an image. The display unit 730 includes the display apparatus according to any of the above-mentioned embodiments.

APPLICATION EXAMPLE 4

Figure 15:
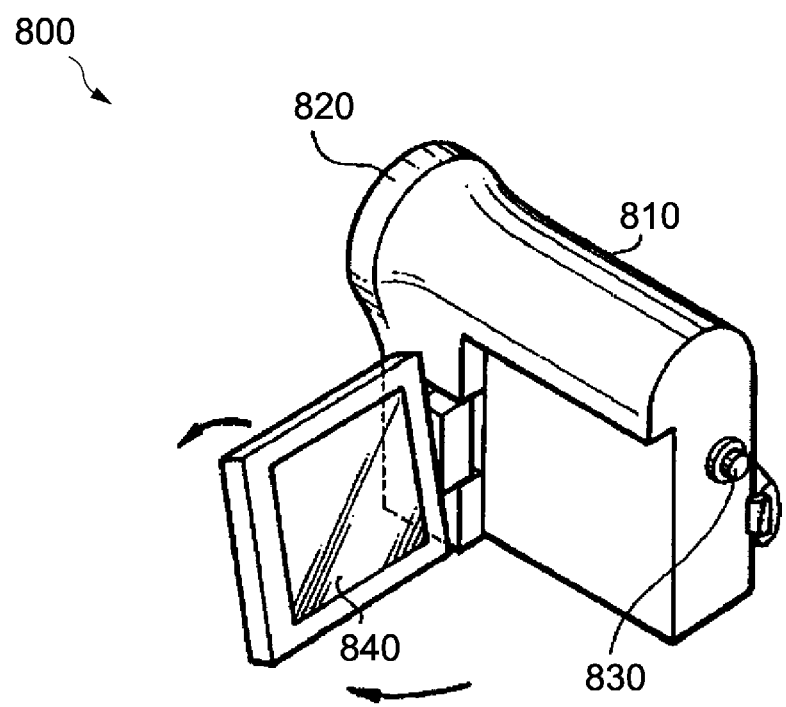
FIG. 15 is a diagram showing an appearance of a video camera as an electronic apparatus.

FIG. 15 shows an appearance of a video camera 800 as an electronic apparatus. This video camera includes, for example, a main body 810, a lens 820 for imaging an object, which is provided on the front side of the main body 810, a start/stop switch 830 at the time of imaging, and a display unit 840. The display unit 840 includes the display apparatus according to any of the above-mentioned embodiments.

APPLICATION EXAMPLE 5

Figure 16:
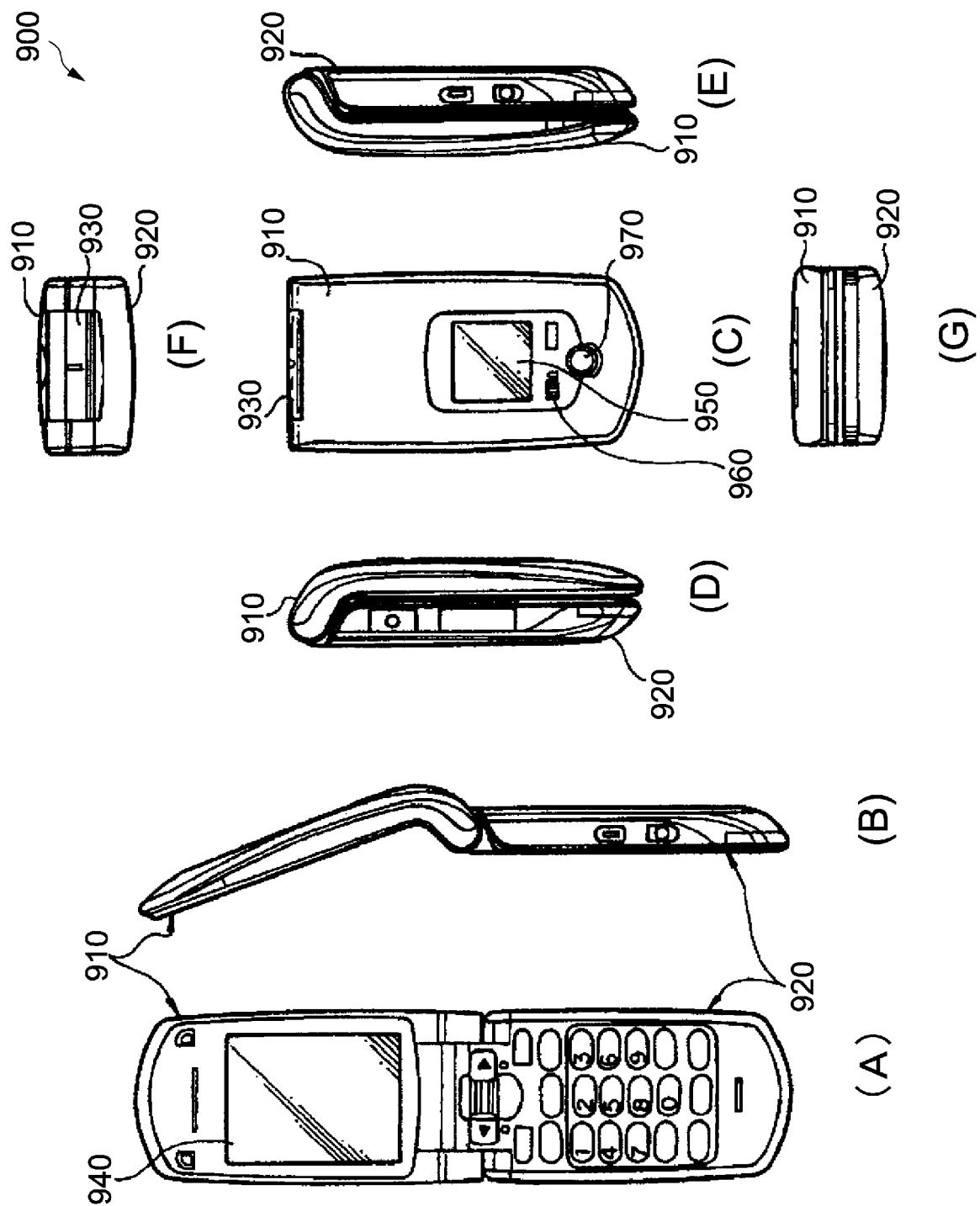
FIG. 16 is a diagram showing an appearance of a mobile phone as an electronic apparatus.
Figure 17:
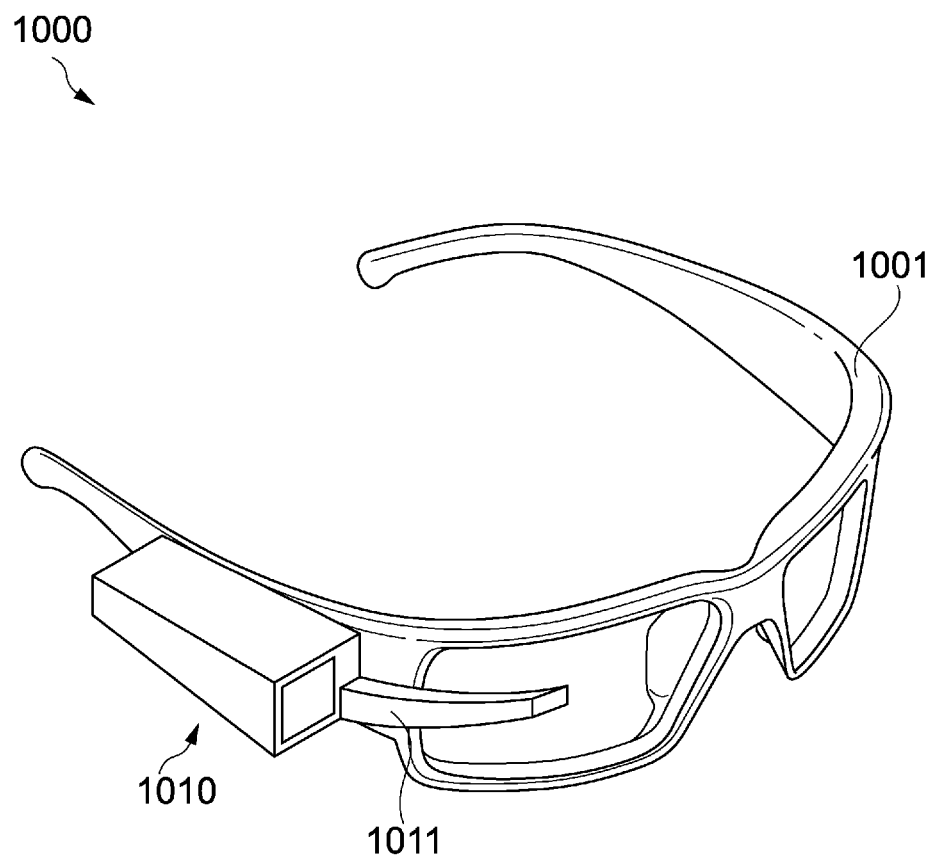
FIG. 17 is a diagram showing an appearance of a head-mounted display as an electronic apparatus.

FIG. 16 shows an appearance of a mobile phone 900 as an electronic apparatus. This mobile phone is obtained by, for example, connecting an upper housing 910 and a lower housing 920 by a connection portion (hinge portion) 930, and includes a display 940, a sub-display 950, a picture light 960, and a camera 970. The display 940 or the sub-display 950 includes the display apparatus according to any of the above-mentioned embodiments.

APPLICATION EXAMPLE 6

FIG. 16 shows an appearance of a head-mounted display 1000 as an electronic apparatus. This head-mounted display is obtained by mounting an eyewear-mounting-type one-eye display 1010 on an eyewear 1000 such as glasses, goggles, and sunglasses. The eyewear-mounting-type one-eye display 1010 includes the display apparatus according to any of the above-mentioned embodiments.

Further, the display apparatus according to any of the above-mentioned embodiments is applicable also to, for example, a VR (Virtual Reality), AR (Augmented Reality), MR (Mixed Reality) head-mounted display as another form of the head-mounted display.

Embodiments of the present disclosure are not limited the above-mentioned embodiments, and various modifications can be made without departing from the essence of the present disclosure.

For example, although an example in which the transistor is formed on the silicon semiconductor substrate has been described in the above-mentioned embodiments, the transistor may be formed on a substrate formed of glass or the like on which a semiconductor film is formed as a silicon area.

Further, although the PMOS in which the conductive type of each of the channels of various transistors is p-type have been described as an example in the above-mentioned embodiments, an NMOS in which the conductive type is n-type.

Further, the display apparatus according to an embodiment of the present disclosure is applicable to electronic apparatuses such as a monitor apparatus that configures a television receiver or a digital camera, a monitor apparatus that configures a video camera, a monitor apparatus that configures a personal computer, portable information terminal, a mobile phone, a smartphone, a portable music player, a game machine, an electronic book, various display units in an electronic dictionary, an electronic view finder, and a head-mounted display.

Further, although an example in which the light emitting unit is configured by using an OLED has been described in the above-mentioned embodiments, in addition thereto, a self-luminous light emitting unit such as an inorganic electroluminescent light emitting unit, an LED (Light Emitting Diode) light emitting unit, and a semiconductor laser light emitting unit may be used as the light emitting unit.

Note that, the present disclosure may also take the following configurations.

(1) A display apparatus, including:
a first semiconductor substrate that includes a light emitting unit and a first drive circuit, the first drive circuit driving the light emitting unit; and
a second semiconductor substrate that includes a second drive circuit to be electrically connected to the first drive circuit, the second semiconductor substrate being bonded to the first semiconductor substrate.

(2) The display apparatus according to (1) above, in which
the light emitting unit includes a plurality of light emitting devices arranged in matrix, and
the first drive circuit is at least a part of pixel circuits that individually drive the plurality of light emitting devices.

(3) The display apparatus according to (2) above, in which
the first drive circuit is a part of the pixel circuits, and
the second drive circuit is another part of the pixel circuits.

(4) The display apparatus according to (3) above, in which
the first drive circuit includes a transistor that switches a signal voltage or a power supply voltage, and
the second drive circuit includes a transistor that controls a current flowing to the light emitting unit.

(5) The display apparatus according to (4) above, in which
the second drive circuit further includes a transistor that resets a voltage applied to the plurality of light emitting devices.

(6) The display apparatus according to (3) above, in which
the first drive circuit includes a transistor that controls a current flowing to the light emitting unit, and
the second drive circuit includes a transistor that switches a signal voltage or a power supply voltage.

(7) The display apparatus according to (6) above, in which
the first drive circuit further includes a transistor that resets a voltage applied to the plurality of light emitting devices.

(8) The display apparatus according to any one of (3) to (7) above, in which
the first drive circuit includes a first capacitive device, and
the second drive circuit includes a second capacitive device electrically connected to the first capacitive device.

(9) The display apparatus according to any one of (3) to (7) above, in which
the second drive circuit includes a first capacitive device and a second capacitive device electrically connected to the first capacitive device.

(10) The display apparatus according to (2) above, in which
the first drive circuit is a pixel circuit that individually drives the plurality of light emitting devices, and
the second drive circuit is a peripheral circuit that supplies a signal voltage or a power supply voltage to the pixel circuit.

(11) The display apparatus according to any one of (1) to (10) above, in which
the first semiconductor substrate and the second semiconductor substrate each include a substrate body and a wiring layer, and
the wiring layer of the first semiconductor substrate is bonded to the wiring layer of the second semiconductor substrate.

(12) The display apparatus according to any one of (1) to (10) above, in which
the first semiconductor substrate and the second semiconductor substrate each include a substrate body and a wiring layer, and
the substrate body of the first semiconductor substrate is bonded to the wiring layer of the second semiconductor substrate.

(13) A method of producing a display apparatus, including:
preparing a first semiconductor substrate that includes a light emitting unit and a first drive circuit, the first drive circuit driving the light emitting unit;
preparing a second semiconductor substrate that includes a second drive circuit; and
electrically connecting the first drive circuit and the second semiconductor substrate by bonding the first semiconductor substrate and the second semiconductor substrate to each other.

It should be understood by those skilled in the art that various modifications, combinations, sub-combinations and alterations may occur depending on design requirements and other factors insofar as they are within the scope of the appended claims or the equivalents thereof.

What is claimed is:
1. A display apparatus, comprising:
a first semiconductor substrate that includes a light emitting unit and a first drive circuit, the first drive circuit driving the light emitting unit; and
a second semiconductor substrate that includes a second drive circuit to be electrically connected to the first drive circuit, the second semiconductor substrate being bonded to the first semiconductor substrate, wherein
the light emitting unit includes a plurality of light emitting devices arranged in matrix,
the first drive circuit is a first part of pixel circuits that individually drive the plurality of light emitting devices, and
the second drive circuit is a second part of the pixel circuits.

2. The display apparatus according to claim 1, wherein
the first drive circuit includes a transistor that switches a signal voltage or a power supply voltage, and
the second drive circuit includes a transistor that controls a current flowing to the light emitting unit.

3. The display apparatus according to claim 2, wherein the second drive circuit further includes a transistor that resets a voltage applied to the plurality of light emitting devices.

4. The display apparatus according to claim 1, wherein
the first drive circuit includes a transistor that controls a current flowing to the light emitting unit, and
the second drive circuit includes a transistor that switches a signal voltage or a power supply voltage.

5. The display apparatus according to claim 4, wherein the first drive circuit further includes a transistor that resets a voltage applied to the plurality of light emitting devices.

6. The display apparatus according to claim 1, wherein
the first drive circuit includes a first capacitive device, and
the second drive circuit includes a second capacitive device electrically connected to the first capacitive device.

7. The display apparatus according to claim 1, wherein the second drive circuit includes a first capacitive device and a second capacitive device electrically connected to the first capacitive device.

8. The display apparatus according to claim 1, wherein
the first drive circuit is a pixel circuit that individually drives the plurality of light emitting devices, and
the second drive circuit is a peripheral circuit that supplies a signal voltage or a power supply voltage to the pixel circuit.

9. The display apparatus according to claim 1, wherein
the first semiconductor substrate and the second semiconductor substrate each include a substrate body and a wiring layer, and
the wiring layer of the first semiconductor substrate is bonded to the wiring layer of the second semiconductor substrate.

10. The display apparatus according to claim 1, wherein
the first semiconductor substrate and the second semiconductor substrate each include a substrate body and a wiring layer, and
the substrate body of the first semiconductor substrate is bonded to the wiring layer of the second semiconductor substrate.

11. A method of producing a display apparatus, comprising:
forming a first semiconductor substrate that includes a light emitting unit and a first drive circuit, the first drive circuit driving the light emitting unit;
forming a second semiconductor substrate that includes a second drive circuit; and
electrically connecting the first drive circuit and the second semiconductor substrate by bonding the first semiconductor substrate and the second semiconductor substrate to each other, wherein
the light emitting unit includes a plurality of light emitting devices arranged in matrix,
the first drive circuit is a first part of pixel circuits that individually drive the plurality of light emitting devices, and
the second drive circuit is a second part of the pixel circuits.

12. The method according to claim 11, wherein
the first drive circuit includes a transistor that switches a signal voltage or a power supply voltage, and
the second drive circuit includes a transistor that controls a current flowing to the light emitting unit.

13. The method according to claim 12, wherein the second drive circuit further includes a transistor that resets a voltage applied to the plurality of light emitting devices.

14. The method according to claim 11, wherein
the first drive circuit includes a transistor that controls a current flowing to the light emitting unit, and
the second drive circuit includes a transistor that switches a signal voltage or a power supply voltage.

15. The method according to claim 14, wherein the first drive circuit further includes a transistor that resets a voltage applied to the plurality of light emitting devices.

16. The method according to claim 11, wherein
the first drive circuit includes a first capacitive device, and
the second drive circuit includes a second capacitive device electrically connected to the first capacitive device.

17. The method according to claim 11, wherein the second drive circuit includes a first capacitive device and a second capacitive device electrically connected to the first capacitive device.

18. The method according to claim 11, wherein
the first drive circuit is a pixel circuit that individually drives the plurality of light emitting devices, and
the second drive circuit is a peripheral circuit that supplies a signal voltage or a power supply voltage to the pixel circuit.

19. The method according to claim 11, wherein
the first semiconductor substrate and the second semiconductor substrate each include a substrate body and a wiring layer, and
the wiring layer of the first semiconductor substrate is bonded to the wiring layer of the second semiconductor substrate.

20. The method according to claim 11, wherein
the first semiconductor substrate and the second semiconductor substrate each include a substrate body and a wiring layer, and
the substrate body of the first semiconductor substrate is bonded to the wiring layer of the second semiconductor substrate.

* * * * *